United States Patent
Meltzer et al.

(10) Patent No.: US 7,686,505 B2
(45) Date of Patent: Mar. 30, 2010

(54) METHOD AND SYSTEM FOR INDIRECT DETERMINATION OF LOCAL IRRADIANCE IN AN OPTICAL SYSTEM

(75) Inventors: Frank Meltzer, Reisbürg-Utzmemmingen (DE); Axel Scholz, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 718 days.

(21) Appl. No.: 11/343,471

(22) Filed: Jan. 31, 2006

(65) Prior Publication Data
US 2006/0222044 A1 Oct. 5, 2006

(30) Foreign Application Priority Data
Feb. 1, 2005 (DE) .................... 10 2005 004 460

(51) Int. Cl.
*G01K 7/00* (2006.01)
*G01J 5/00* (2006.01)

(52) U.S. Cl. .............. 374/137; 374/121; 374/124; 374/130; 374/179; 374/183

(58) Field of Classification Search .......... 374/121, 374/137, 124, 130
See application file for complete search history.

(56) References Cited

U.S. PATENT DOCUMENTS

| 6,198,793 B1 | 3/2001 | Schultz et al. ............... 378/34 |
|---|---|---|
| 6,600,552 B2 | 7/2003 | Dinger ............... 355/67 |
| 7,494,272 B2 * | 2/2009 | Thomas et al. ............... 374/53 |
| 2001/0036219 A1 * | 11/2001 | Camm et al. ............... 374/112 |
| 2003/0146391 A1 | 8/2003 | Kleinschmidt et al. ....... 250/372 |
| 2003/0235682 A1 * | 12/2003 | Sogard ............... 428/195.1 |
| 2006/0000812 A1 * | 1/2006 | Weber et al. ............ 219/121.61 |

FOREIGN PATENT DOCUMENTS

| JP | 62238677 A | * | 10/1987 |
|---|---|---|---|
| JP | 63072116 | | 4/1988 |
| JP | 05288696 | | 11/1993 |

OTHER PUBLICATIONS

Ulrich et al. "Trends in Optical Design of Projection Lenses for UV-Lithography and EUV-Lithography", Soft X-Ray and EUV Imaging Systems, Proceedings of SPIE, vol. 4146 (2000), pp. 13-24.
Antoni et al. "Illumination Optics Design for EUV-Lithography", Soft X-Ray and EUV Imaging Systems, Proceedings of SPIE, vol. 4146 (2000), pp. 25-34.

* cited by examiner

*Primary Examiner*—Gail Verbitsky
*Assistant Examiner*—Mirellys Jagan
(74) *Attorney, Agent, or Firm*—Fish & Richardson P.C.

(57) ABSTRACT

The invention concerns a method for the indirect determination of local irradiance in an optical system; wherein the optical system comprises optical elements between which an illuminated beam path is formed and a measurement object which absorbs the radiation in the beam path at least partially is positioned in a partial region of the beam path selected for the locally-resolved determination of the irradiance and the temperature distribution of at least one part of the measurement object is determined by means of a temperature detector.

12 Claims, 5 Drawing Sheets

METHOD AND SYSTEM FOR INDIRECT DETERMINATION OF LOCAL IRRADIANCE IN AN OPTICAL SYSTEM

BACKGROUND OF THE INVENTION

1. Field of the Invention

The invention concerns a method for the indirect determination of local irradiance in an optical system, in particular for a partial region of an optical system, such as the beam profile at a selected site of the beam path or of the irradiance on a component of the optical system, wherein the method is applied, in particular, to an optical system with an EUV light source as an illumination source.

2. Description of the Related Art

Optical systems with EUV illumination sources are developed, in particular, for EUV lithography systems, for the purpose of obtaining, by use of wavelengths of $\leq 193$ nm, pattern widths for electronic components in the submicron range. For this lithography technique with soft x-rays, so-called EUV lithography is preferred, the wavelength range being from $\lambda=11$ nm to 14 nm and, in particular, $\lambda=13.5$ nm, whereby the use of numeric apertures in the range of 0.2-0.3 is discussed. For example, synchrotron sources or plasma sources can be used as illumination sources for this wavelength region.

The image quality in EUV lithography is determined, on the one hand, by the projection objective, and, on the other hand, by the illumination system. The illumination system will provide an illumination that is as uniform as possible of the field plane, in which the pattern-bearing mask, the so-called reticle, is disposed. The projection objective images the field plane in an image plane, the so-called wafer plane, in which a light-sensitive object is disposed. Projection exposure systems for EUV lithography are designed with reflective optical elements. The shape of the field of an EUV projection exposure system is typically that of an annular field with a high aspect ratio of 2 mm (length of the scanning slit)×22-26 mm (width of the scanning slit). The projection systems are usually operated in scanning mode, whereby the reticle will be moved in the field plane and the light-sensitive object, typically a wafer with a suitable photoresist, will be moved synchronously in the image plane, relative to one another. With respect to EUV projection exposure systems, reference is made to the following publications:

W. Ulrich, S. Beiersdörfer, H. J. Mann, "Trends in Optical Design of Projection Lenses for UV-Lithography and EUV-Lithography" in Soft-X-Ray and EUV Imaging Systems, W. M. Kaiser, R. H. Stulen (Editors), Proceedings of SPIE, Vol. 4146 (2000), pages 13-24 and M. Antoni, W. Singer, J. Schultz, J. Wangler, I. Escudero-Sanz, B. Kruizinga, "Illumination Optics Design for EUV-Lithography" in Soft X-Ray and EUV Imaging Systems, W. M. Kaiser, R. H. Stulen (Editors), Proceedings of SPIE, Vol. 4146 (2000), pages 25-34.

A problem that occurs particularly for optical systems in the EUV range is that beam profile measurements for obtaining and also for monitoring the state of adjustment of the optical components of the optical system are difficult to conduct due to the short wavelengths. Information of the beam profile is also of advantage for evaluating the performance capacity of optical components.

This same problem arises also in determining the irradiance on the optical components used in the illumination system. This determination is of particular importance for EUV illumination systems, since here reflective optical components are used exclusively, which can be constructed as grazing-incidence or normal-incidence systems. Characteristic of such EUV optics is their limited reflectivity, which deteriorates in operation, due to deposits or possible degradation defects on the mirror surfaces. This problem again makes it necessary to regularly examine the local irradiance, at least in partial regions or on selected subcomponents of such an illumination system, whereby, in particular, in addition to the characteristic of spatial irradiance, a quantitative determination or a sufficiently accurate estimation of the irradiance is also required.

The methods that have become known from the prior art for monitoring optical systems in the EUV region concern EUV light sources almost exclusively. Thus, in US 2003/0146391, a detector is proposed for monitoring the irradiated light power of an EUV plasma source, which is found in a detection beam path separate from the illumination beam path. Here, the étendue value of the detection beam path is adapted to any illumination beam path in order to simulate this as precisely as possible. It is a disadvantage in US 2003/0146391, however, that the measurement of the irradiated light power in a separate beam path is insufficient by itself to assure that an error with an effect on the imaging in the image plane does not occur, namely an inhomogeneously illuminated field, a telecentric error, or a dose error.

The determination of secondary electrons, which come from an absorbing mask for proximity exposure with x-ray light, has become known from JP 63-072,116. A locally-resolved measurement for the determination of dose errors or a contamination of optical components, however, is not possible.

A method for monitoring the degree of fouling of a mirror for synchrotron radiation has become known from JP 05-288,696. Here, the photocurrent integrated over the mirror surface is determined, but there is no information on the local distribution of irradiance.

Measurements of the beam profile, which are the subject of the present application, are usually conducted with semiconductor detectors, in particular, in the visible or infrared regions of the spectrum. A typical field of application is the measurement of laser beam profiles or the determination of illumination characteristics of illumination systems. Usual here is the use of silicon, germanium or gallium arsenide detectors, which are comprised of a combination of a linear detector with a pin diaphragm and a precise positioning system, which can be used for the scanning measurement of a beam profile. Alternatively, area detectors, such as CCD sensors or CMOS sensors, which are usually integrated in a camera system, are used for this purpose. The advantage of area detectors when compared with linear detectors, above all, is the savings of time when conducting a measurement.

With respect to beam and illumination diagnostics for illumination systems which use short wavelengths, in particular in the EUV region, a fluorescence converter can be utilized, with which radiation in a wavelength region of 10 nm up to approximately 350 nm can be successfully converted into the visible wavelength region, , so that a standard camera with a Si-CCD detector can be used for taking images. It is a disadvantage with the use of fluorescence converters, however, that they are suitable only to a limited extent for beam profile measurements for illumination systems with a high illumination intensity. This applies, in particular, to the EUV region in which the absorbed radiation rapidly leads to an overheating and to the degradation of the fluorescence converter or to a change of the conversion efficiency and thus leads to a falsification of the measurement. This limitation essentially applies also to the DUV and the VUV wavelength regions, in addition to the EUV wavelength region. Thus, EUV photodiodes in row or matrix arrangement, which measure the photocurrent or photoelectrons in a locally-resolved manner, are preferred for the EUV region.

Additional requirements for a method or a measurement system for determining the local irradiance in an optical system for the wavelength region of ≦193 nm and, in particular, in the EUV region, result from the requirements relative to constructability and vacuum conditions. The known detector systems often can be integrated into the illumination beam path and encapsulated by vacuum technology only at increased expense. Furthermore the problem occurs that such detector systems necessarily interrupt the beam path during the measurement and, therefore, further measures are necessary for positioning of all measurement components used for the measurement of the beam profile or the illumination characteristic. Continuous measurements or routine inspections, which can be conducted without interfering with the state of adjustment, are thus possible only with difficulty with the known detection systems.

Another disadvantage with the use of the known measurement systems for determining beam profiles or the local irradiance on an optical component results from the fact that detectors are adapted to the wavelength region that is used in each case, for example, by means of a coating layer using a film filter, so that common detection systems are not suitable for broadband spectra—IR, VIS, UV, DUV, VUV and EUV. A universal measurement method or measurement system that can be used over a broad wavelength region is of advantage in itself. For applications in EUV lithography systems, in particular, an adjustment can then be carried out with adjustment illumination outside the used wavelengths for EUV, without the need for changing the measurement system. The same set of problems is also to be encountered in optical systems for the DUV and VUV wavelength regions.

SUMMARY OF THE INVENTION

The object of the invention is to overcome the above-described disadvantages of the prior art and to provide a method and a measurement system associated with it, with which it is possible in a simple manner to determine the beam profile in an optical beam path or the irradiance on a component of an optical system, which is provided in particular for the short wavelength region of ≦193 nm and also, in particular, for the EUV region. This determination should be sufficiently accurate so that the spatial intensity distribution of the radiation in the beam path, in particular the beam profile or the irradiance on an optical component can be detected and, in particular, a quantitative determination of the irradiance results. In addition, the method should be universally applicable, i.e., for a broad wavelength region and, in particular, for the spectral regions of IR, VIS, UV, DUV, VUV and EUV. Further, the measurement method and the measurement system belonging thereto will be suitable for routine measurements in the optical system to be monitored, i.e., measurements can be conducted without a change in the state of adjustment and with only small expense for the alignment of the measurement system. In addition, the measurement system will be robust.

For the method according to the invention, the inventors have recognized that with a locally resolved measurement of the heating up of an optical component of an optical system due to the illumination radiation that occurs, which is absorbed at least partially, an indirect determination of irradiance is possible. For this purpose, by means of a temperature detector, for example, a camera that is sensitive in the infrared wavelength region or an arrangement of temperature sensors in thermal contact with the measurement object, the spatial temperature distribution on the optical component of the optical system selected for investigation is determined. These measurements can be conducted either during the warming up or after a stationary temperature distribution has been adjusted.

Corresponding to a variant according to the invention, instead of an optical component of the optical system, an object absorbing the illumination radiation in the beam path of the optical system is introduced for measurement at the site of the illumination beam path to be investigated and the temperature which is adjusted on its surface is determined. After the measurement, the object which has been introduced is removed again. In the present invention, the term measurement object is thus used both for an optical component of the optical system selected for the temperature measurement as well as also for a special object introduced into the beam path only for measurement purposes.

Suitable detectors for determining the temperature of the measurement object are, for example, measurement systems operating in a contact-free manner, in particular CCD camera systems sensitive in the infrared or, alternatively, linear detectors for the infrared that operate by scanning. These detectors are thus of advantage, since they can determine the surface temperature of the selected optical component or of the measurement object without blocking the beam path of the optical system to be investigated.

Alternatively, detectors which are found in direct thermal contact with the measurement object can also be utilized for temperature determination. It is therefore possible, for example, to introduce thermocouples or thermoresistors as a detector matrix on the back of a reflective optical component or on facet mirrors, onto the mirror surface between the individual facets. Other detector arrangements are conceivable, which are suitable for the purpose of sufficiently precisely determining the spatial temperature distribution on the irradiated surface.

A measurement object can be selected correspondingly so that one can proceed essentially from a known absorption at the surface for the radiation in the optical system. A measurement object is then particularly well suitable for conducting the method according to the invention, if its absorption behavior approximates as much as possible that of a black box. In the case of an ideal black box, the surface completely absorbs the incident illumination radiation and emits electromagnetic waves corresponding to the surface temperature, i.e., it emits with the maximum spectral emission capacity according to Planck's Law. The irradiance of the incident radiation can be derived particularly precisely from the temperature determination for such a preferred measurement object.

The starting point for the relationship between the heating of the surface of a measurement object or an optical component is the general equation for heat conduction:

$$\dot{T} = \frac{\lambda}{\rho c}\Delta T + \dot{Q},$$

which describes the change in the temperature T over time. Here, $\dot{T}$ is the time derivative of the temperature, $\lambda$ is the heat conductivity, c is the specific heat capacity, $\rho$ is the density and $\dot{Q}$ is the source density for the internal heat input, in this case caused by the illumination radiation absorbed near the surface.

For the method according to the invention, it is preferably assumed that the illumination radiation is absorbed only by the layer directly at the surface. It is thus true for the surface layer that the source term $\dot{Q}$ in the heat conduction equation is approximately proportional to the local irradiance. Within the scope of the knowledge of the person skilled in the art, it is possible, however, to proceed from a model assumption for the depth of penetration of the electromagnetic radiation.

In a first approximation, the change in the surface temperature over time thus can be set up as a linear dependence relative to the source term $\dot{Q}$ and thus as proportional to the local irradiance. Corresponding to this consideration, the diffusion term $$\frac{\lambda}{\rho c} \Delta T$$

of the heat conduction equation can be disregarded initially. This is possible if one can start with a small temperature conductance value ($\lambda/\rho c$). In addition to the possibility of influencing the magnitude of the temperature conductance value by an appropriate selection of material, the diffusion term is then small, if the spatial temperature differences are still sufficiently negligible. It is thus of advantage to carry out the temperature determination directly after a discontinuity in the irradiance and to compare it with a temperature distribution assumed to be stationary prior to the discontinuity. It follows from this in turn that a particularly sensitive detector should be used preferably for the determination of such a temperature change vs. time, which is called the "initial" in the following.

For an optical component active in the optical system, a discontinuity in the irradiance can be achieved, for example, by turning on the illumination or correspondingly by operating a diaphragm. For a measurement object that does not permanently remain in the beam path, the described discontinuity in the irradiance can be effected by a sufficiently rapid introduction into the beam path. Spatial differences result for the initial heating up of the irradiated measurement surface, as a function of the beam profile of the radiation impinging on the measurement object.

It is also of advantage with respect to the local resolution of a selected measurement object, if the lateral temperature conductance is as small as possible. The use of a segmented structure is advantageous; for example, this can be of a raster shape, in which the individual segments are thermally separated from one another as much as possible. According to an advantageous embodiment, the temperature of each of these individual segments under irradiation is then determined. A similar advantageous measurement situation results with the use of a facet mirror as an optical component of an optical system as the measurement object, since, when forming the facets, it is possible to provide for a sufficient thermal separation between the individual facets. When a mirror with a continuous surface is used, a lateral thermal decoupling can be provided by the appropriate configuration of the mirror unit with respect to selection of material and geometry. Thus, e.g., it is possible to employ recesses or an arrangement of layers of material with a high resistance to heat transfer in the transition region between individual segments of the mirror unit.

For the initial temperature determination, a sequence of temperature measurements is preferably to be conducted at known time points and thus a temperature course is determined, from which the initial change in temperature vs. time resulting upon a discontinuity in the irradiance at time point $T_0$ can be determined particularly precisely as a tangent to time point $T_0$ of the temperature vs. time curve.

In correspondence with one variant of the method according to the invention, it is conceivable not only to determine the initial temperature change vs. time at the irradiated surface of the measurement object or of the investigated optical component and to disregard the diffusion term of the heat conduction equation, but to estimate the energy input and thus the irradiance from the temperature curve vs. time and space during heating up. This presumes that the geometry of the object as well as the spatial course of the temperature conductance and of the heat outflow at the boundaries of the object are known or can be sufficiently precisely estimated. In general, it will not be possible to provide consistent solutions for this, so that numerical methods, for example, the method of finite elements must be employed. In addition, it is of advantage in this case, if not only the temperature of the irradiated surface is measured, but also if the temperature curve of the entire body of the measurement object or of the optical component can be plotted by means of sensors that are very closely distributed in space. This variant of the method according to the invention is more complicated both in terms of measurement technology as well as in terms of modeling, but it can be of advantage, if a discontinuity of the irradiance can be conducted without anything further, since further measures would mean an interruption of the operation of the illumination system. In particular, optical components can be continuously monitored during operation, when the change in temperature vs. time is not determined, but when the irradiance can be derived from measurements of the stationary temperature gradients.

For the case when an optical component of the optical system is used as the measurement object, and, in particular, if stationary temperature gradients are measured, information on the deformation of the optical component due to thermal load can be estimated from the temperature distribution. It is then possible to construct the optical component as adaptive optics and to readjust the geometric shape of the functional surface of the optical component based on the temperature data. The change in the optical imaging that results and thus also the irradiance on the optical component of the optical system can in turn be determined by the method according to the invention, so that a regulation of the adaptive optics utilized is made possible.

If, instead of a measurement object, an optical component of the optical system is used directly for the indirect determination of the local irradiance, then there may occur, in particular, if a flat-surface mirror is involved, the additional difficulty that the reflectivity is not constant over the optically active surface. Consequently, it is necessary to determine sufficiently accurately the absorbed portion of the illumination radiation starting from model assumptions or from measurements, so that it is possible to draw conclusions on the local irradiance from the temperature measurements.

In a reverse approach, on the other hand, it is possible to find information on the local reflectivity from the temperature measurements and thus from the determination of the absorbed heat power. The local irradiance is presumed to be known for this case. This can be accomplished, for example, by conducting the method according to the invention on another optical component or an additional measurement object or by directly monitoring the illumination source and thus estimating the irradiance at the site of the optical component to be investigated. In correspondence with this variant of the invention, information on the local reflectivity results from the temperature measurements, which can be used, in particular, for monitoring optical components, particularly of reflective and consequently easily fouled surfaces in the optical system. Such measurements can be conducted routinely after specified operating times in order to obtain information on the degree of fouling and possibly a degradation of the optically active surfaces in an optical system.

If one of the optical components of the optical system is used directly for the method according to the invention for the temperature measurement, then continuous measurements are possible without interrupting the function of the optical system. With the alternative use of a separate measurement object, only one part of the measurement means used for the measurements of the beam profile is introduced in the beam path for conducting the measurement, while, for example, the temperature detector itself can be positioned outside the optical system. This minimizes the apparatus expense, in particular in optical systems in the EUV region, which are kept under vacuum conditions, since the temperature detector is not encapsulated by vacuum technology. Further, the measurement method is robust and universally applicable, since the detection system itself need not be adapted to the radiation used in the optical system and only standard temperature detectors are needed.

BRIEF DESCRIPTION OF THE DRAWINGS

The invention will be described below by way of examples based on the figures.

DESCRIPTION OF THE INVENTION

Figure 1A:
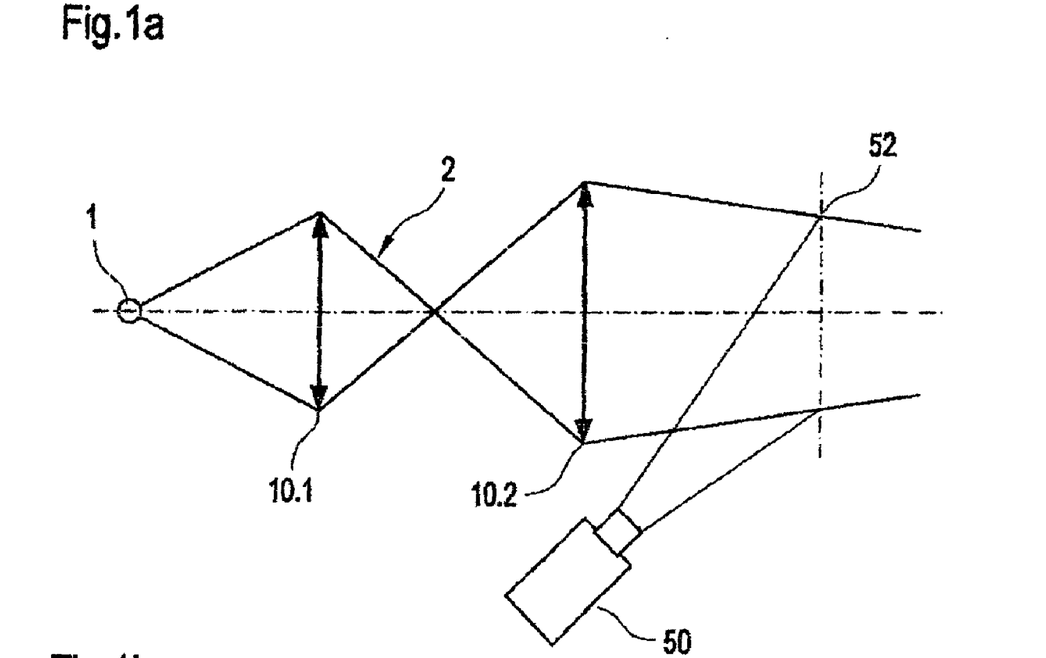
FIG. 1a: Optical system with an optical beam path and a heat image camera.

FIG. 1 a shows in a schematically simplified manner an optical system, which comprises a light source 1, from which is emitted an optical beam path 2. The optical beam path 2 is influenced in the optical system by optical components. Optical components with the reference numbers 10.1 and 10.2 for this purpose are shown schematically in FIG. 1a. These optical components can be refractive or reflective, but only reflective optics can be used for an EUV system. Further, a heat camera 50, which is directed onto a plane of intersection 52 in beam path 2, is shown in FIG. 1a.

Figure 1B:
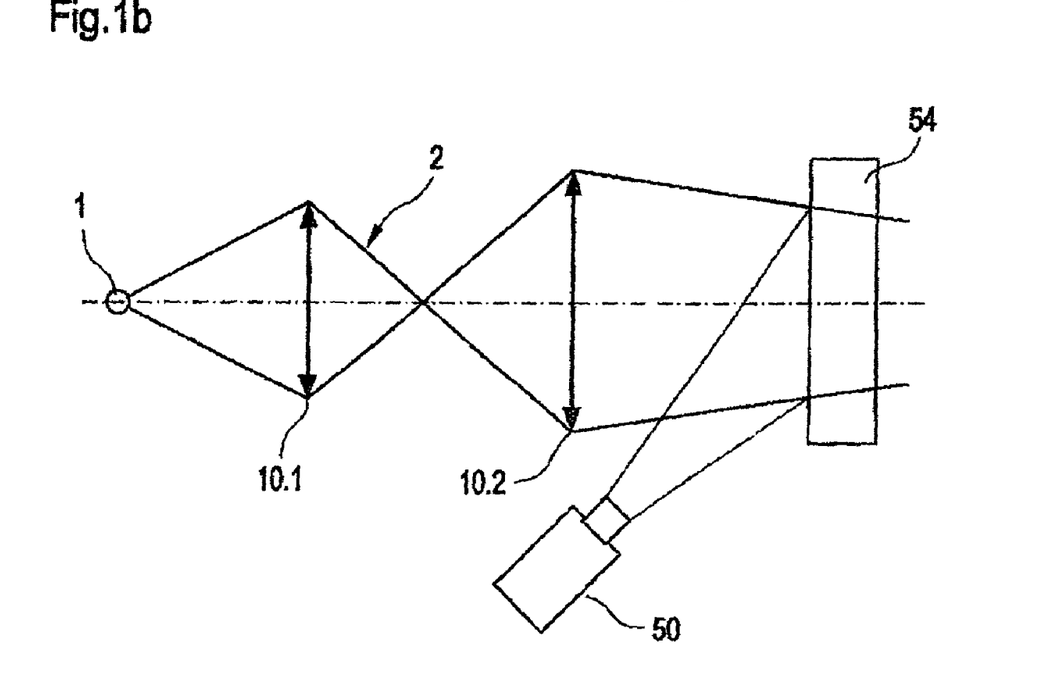
FIG. 1b: Optical system with an optical beam path and a heat image camera for recording the temperature distribution on a measurement object.

In accordance with the method according to the invention, according to the presentation sketched in FIG. 1b, by means of the temperature detector 50, in the present case, a heat camera, the surface temperature is determined for a measurement object 54, which has been introduced, for purposes of measurement, into the optical beam path 2 in the region of the plane of intersection 52 in this example of embodiment. In this way, the heating up process is measured, wherein it is preferred to determine the initial temperature change vs. time on the surface of the measurement object 54. The change in surface temperature vs. time is understood as occurring directly after a discontinuity in the irradiance on the surface of the measurement object. This can be effected, for example, in such a way that the temperature on the surface of the measurement object is determined prior to its introduction into the optical beam path 2 and then directly after this introduction.

Figure 2:
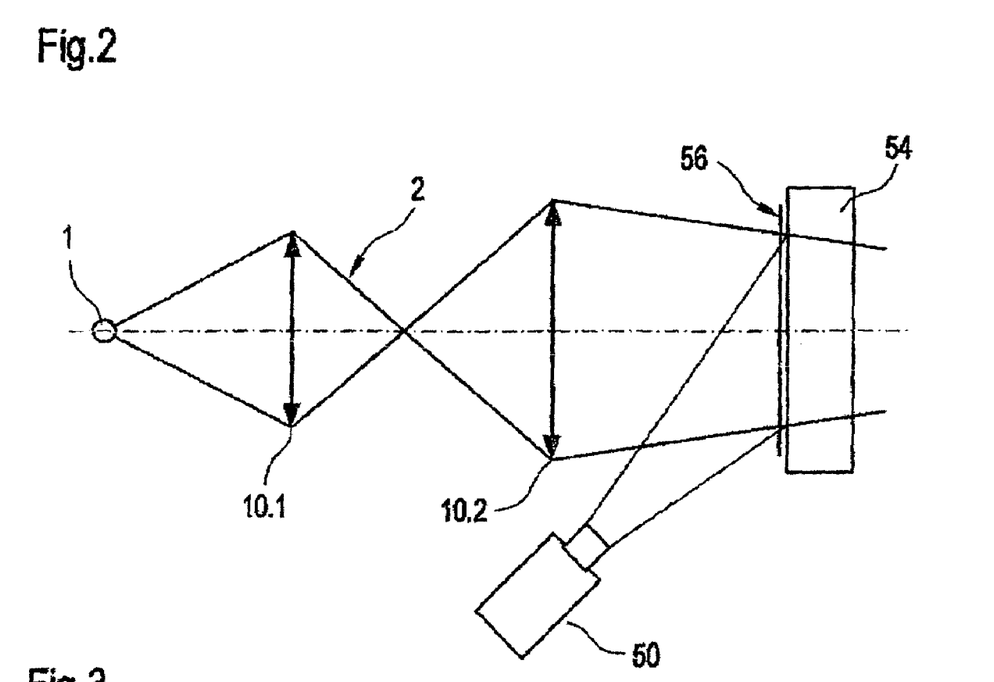
FIG. 2: Optical system with an optical beam path and a heat image camera for recording the temperature distribution on a measurement object which comprises a spectral filter.
Figure 3:
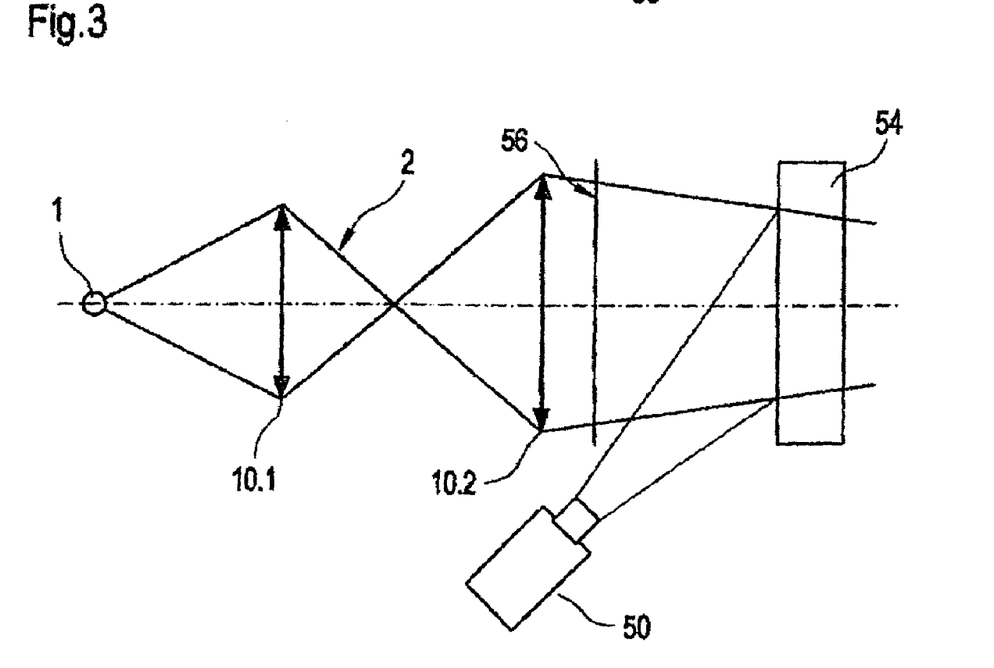
FIG. 3: Optical system with an optical beam path and a heat image camera for recording the temperature distribution on a measurement object, with a spectral filter separated from the measurement object, which is disposed in the beam path upstream of the measurement object.

For optical systems which operate in a broadband wavelength region, it may be of advantage to spectrally filter the radiation impinging on the measurement object. Particularly for EUV systems, it is desired that only the wavelength region used for the useful application impinges on the measurement object in order to determine the beam profile characteristic relevant to the optical system. A spectral filter 56 can be assigned directly to the measurement object 54, which is shown schematically in FIG. 2. Thus it is possible to hold the components of the measurement object 54 and the spectral filter that are heated by the incident radiation in a common holder or to use a film filter directly deposited on the measurement object. The film filter can be formed here so that it selectively absorbs the investigated wavelength region used and to the greatest extent possible reflects the wavelength regions that are to be filtered out. Alternatively, it is also possible to create the spectral filter 56 separately from the measurement object. This filter can then be positioned at a place in the beam path which extends out in front of the measurement object. A corresponding configuration is shown in FIG. 3, which presents an arrangement of a spectral filter 56 positioned in the beam path. A possible configuration of such a spectral filter is a raster spectral filter consisting of a diffraction grating in combination with a diaphragm arrangement.

If a measurement object is introduced into the beam path and is subjected to the irradiation, then in accordance with a preferred measurement variant, the temperature measurement begins immediately by means of the heat detector. The body will be heated up successively, i.e., with increasing heating, the temperature measurement signal is also easier to determine due to the increasing signal-to-noise ratio, but an obliteration of the temperature differences brought about by the spatially different irradiation is, of course, also encountered due to diffusion effects. Since diffusion terms in the heat conduction equation complicate the assignment of heating to the actual incident irradiation, a material which has a low heat conductivity is used particularly as the measurement object. In the present Application, a low heat conductivity $\lambda$ will be understood to mean a heat conductivity that lies in the range of $0<\lambda\leq2$ W/mK. A material with a low heat conductivity is glass ceramics, for example Zerodur® of the Schott Glas company, which has a heat conductivity of $\lambda\approx1.46$ W/mK at a temperature of 20° C.

Figure 4:
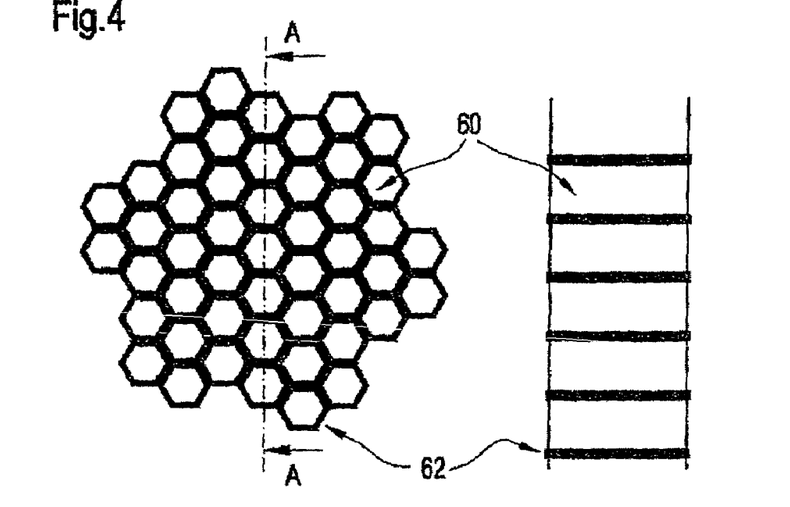
FIG. 4: Construction of the measurement object with segmented structure for limiting the lateral heat conductivity.

Other materials with low heat conductivities are natural quartz or synthetic quartz with a heat conductivity of 1.38 W/mK at 20° C. as well as different types of vitreous materials, for example, window glass, which has heat conductivites, for example, in the range of $0.8$ W/mK$\leq\lambda\leq1.15$ W/mK. Corresponding to an advantageous configuration of the measurement object, the particularly disruptive lateral heat conductivity is reached by a segmented formation of the surface of the measurement object. A possible configuration as a raster structure is sketched in FIG. 4. At the left is shown a view from the top, and at the right is a section along line A-A. Here, the individual segments with sufficiently good conductivity are surrounded by a material of lower heat conductivity, whereby this layer of lower heat conductivity should be disposed laterally to the direction of irradiation. It is also possible to effect a drawing off of temperature by means of a cooling that typically acts on the back side of the irradiated surface of the measurement object. By intentionally building up temperature gradients essentially in the direction of the irradiation causing the input of heat, the undesired lateral obliterating of the temperature curve is reduced.

Figure 5A:
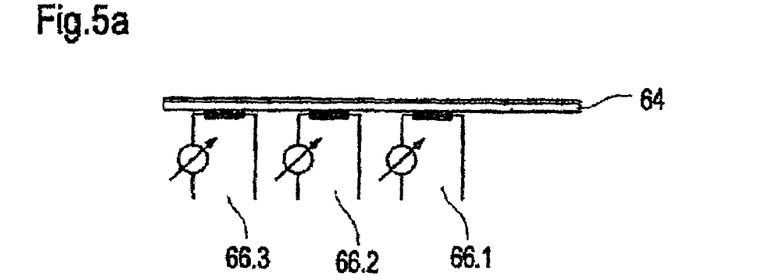
FIG. 5a: Arrangement of thermoresistors or thermocouples on an optical mirror component.
Figure 5B:
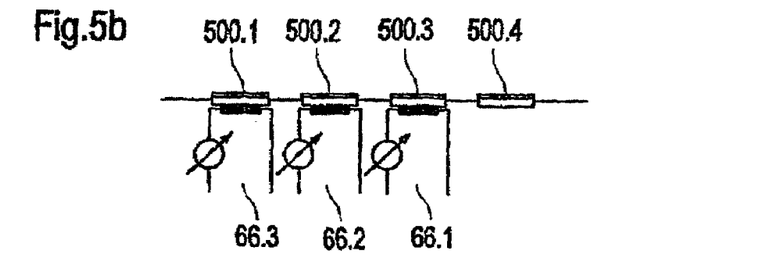
FIG. 5b: Arrangement of thermoresistors or thermocouples on facets of a facet mirror.

FIGS. 5a and 5b show the variants of the method according to the invention, according to which the temperature measurement is not carried out on a separate measurement object, but rather by the determination of the surface temperature of an optical component acting in the optical system. To this end, FIG. 5a shows the arrangement of thermocouples or thermoresistors 66.1, 66.2, 66.3 on the back of a flatly formed mirror 64. It is particularly preferred here to position the thermoresistors or thermocouples 66.1, 66.2, 66.3 used as temperature detectors as close as possible to the irradiated surface.

Figure 6:
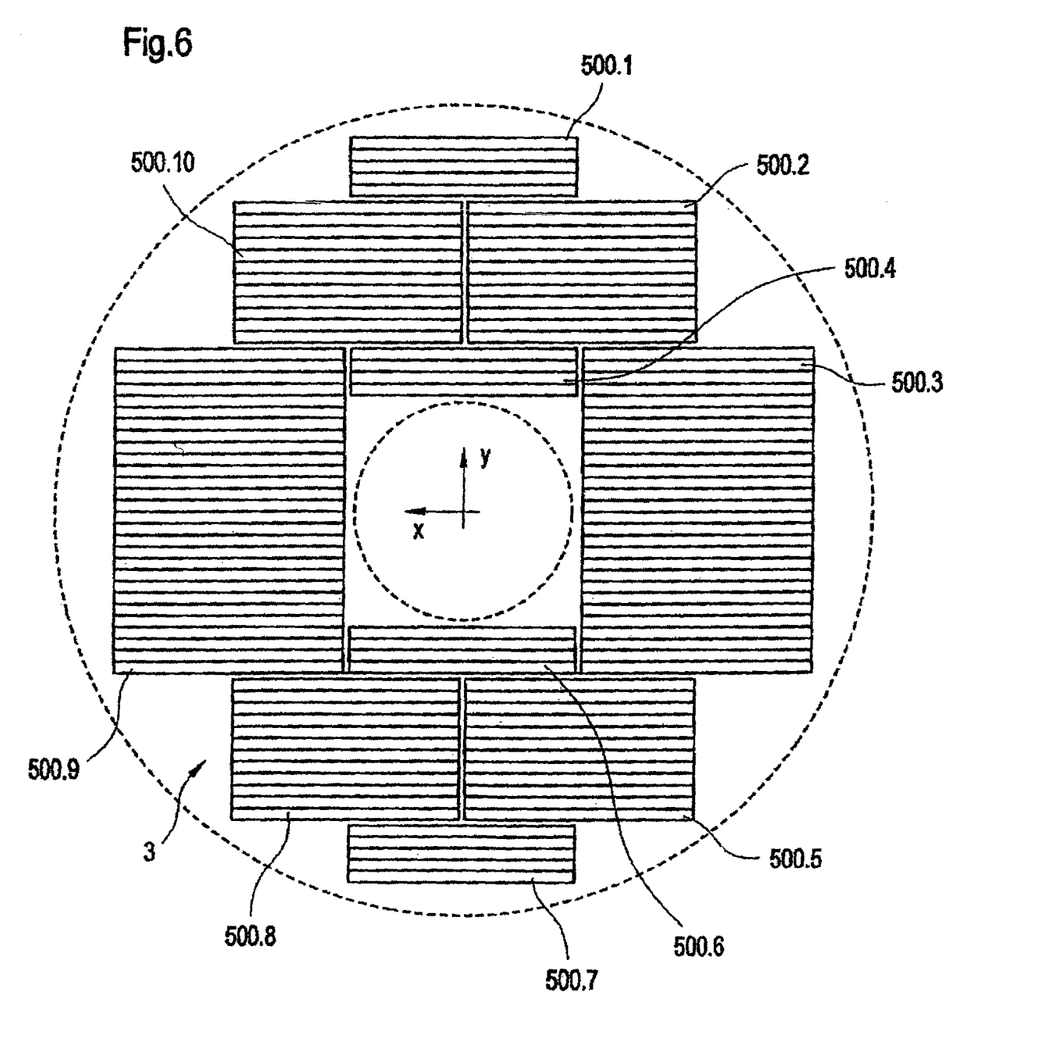
FIG. 6: Schematic representation of a facet mirror.

A variant in the design of the optical component is shown in FIG. 5b. Shown here are individual facets 500.1, 500.2, 500.3 and 500.4 of a facet mirror, wherein the heat measurement by means of the temperature detectors, which are thermoresistors and thermocouples 66.1, to 66.3 in the case shown, is again performed individually on one of these individual facets 500.1-500.4. A temperature measurement is preferably conducted at each of these individual facets. A frontal view of such a facet mirror is depicted in FIG. 6. Here again, individual facets are labeled 500.1-500.10. Facet mirrors are thus preferred for conducting the method according to the invention, since, due to the surface configuration, it is well possible to effect a sufficient lateral thermal decoupling of individual segments of the mirror surface of the optical component. In addition, it is conceivable to accommodate the thermocouples in the intermediate regions between the individual facets, so that these can be disposed as close as possible to the irradiated surface. The diffusion terms that are disruptive for the indirect determination of the local irradiance play a smaller role in the heat conduction equation due to these measures.

Figure 5C:
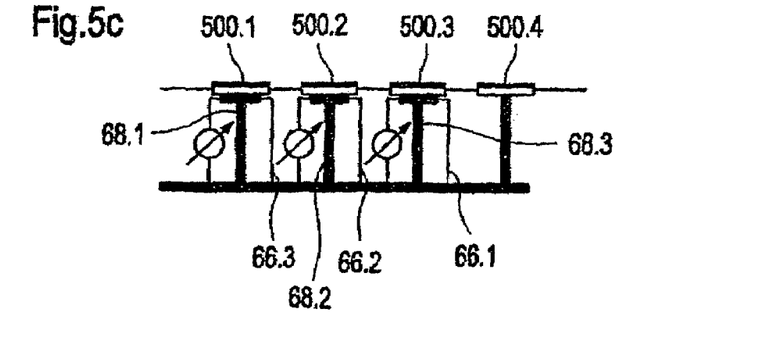
FIG. 5c: Arrangement of thermoresistors or thermocouples in the vicinity of facets of a facet mirror according to FIG. 5b with adjusting elements for the facets for the formation of adaptive optics.

The indirect determination of the irradiance on an optical component according to the invention by means of temperature measurement can advantageously be combined with adaptive optics. In FIG. 5c is depicted a corresponding arrangement, which in addition to the components shown in FIG. 5b, has adjusting elements 68.1, 68.2, 68.3, with which the functional surfaces, in this case, the individual facets of the facet mirror, are readjusted in their position and alignment as a function of the temperature data.

Figure 7:
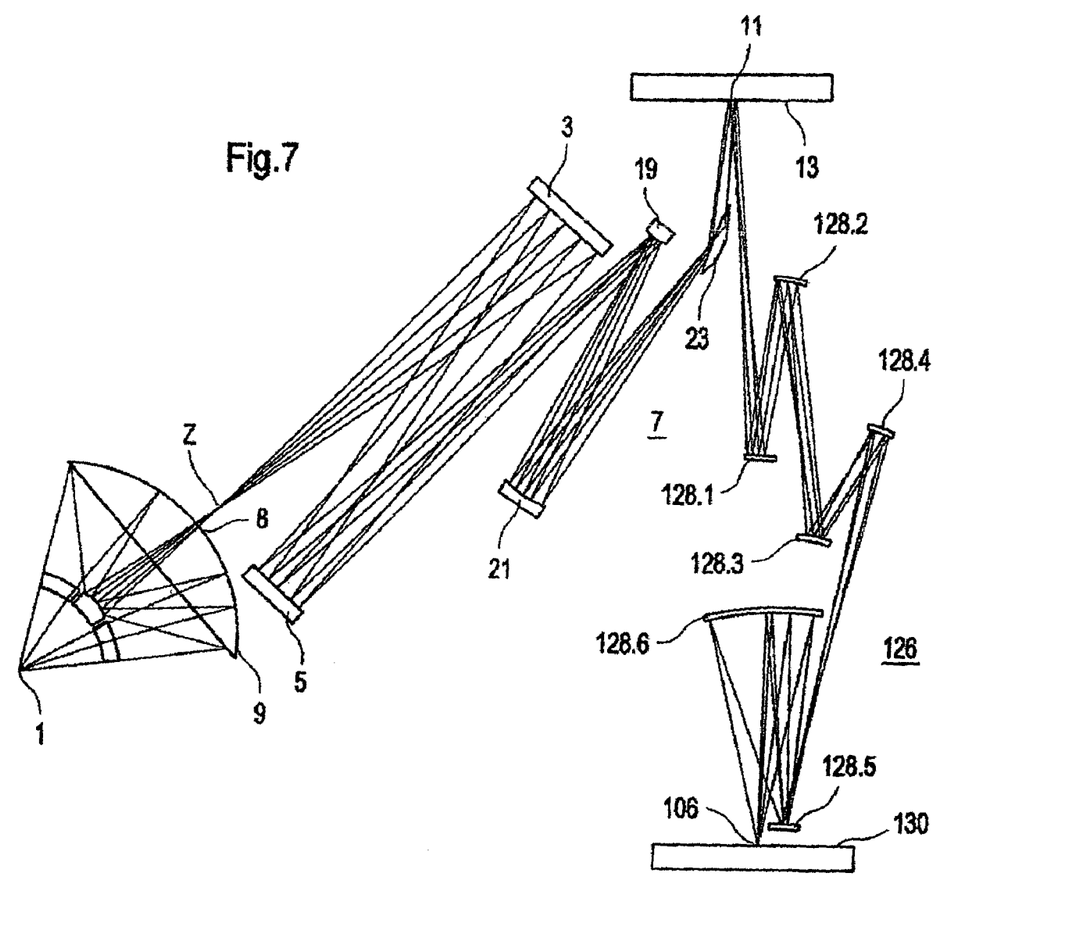
FIG. 7: Sketch of an EUV lithography system comprising an illumination system and a projection system.

A projection exposure system to which the adjustment process according to the invention can be applied is depicted in FIG. 7. Proceeding in the light path from a light source 1 to an illuminated plane, which is called the field plane 13, are shown the optical components of an illumination system and also the projection objective 126.

The following are shown individually in FIG. 7: A reticle or a mask 11 is positioned in the field plane 13 of a projection exposure system, in which preferably an annular field is formed, and is imaged by means of a reduction optics 126 on its imaging plane 130, in which typically a wafer 106 provided with a light-sensitive material is found. FIG. 7 shows for this purpose, as an example, a projection objective consisting of six individual mirrors 128.1 to 128.6, which is derived, for example, from U.S. Pat. No. 6,600,552, which is incorporated to the full extent in the present Application. Also depicted in a telecentric illumination of image plane 130, which is found in the ideal case, is the chief ray of a beam bundle, which proceeds out from a field point of field plane 13, and perpendicularly intersects the image plane 130. In addition, the projection objective 126 has an entrance pupil which in general coincides with the exit pupil of the illumination system.

FIG. 7 also shows the typical structure of an EUV illumination system, which is formed as a double-facetted illumination system according to U.S. Pat. No. 6,198,793 B1, whereby the content of this document is incorporated to the full extent in the present Application. Such a system comprises a first optical element with first raster elements 3, which is also designated as field facet mirror 3. A second optical element with second raster elements 5, which is usually named a pupil facet mirror 5, then follows in the beam path.

Field facet mirror 3 and pupil facet mirror 5 serve for illumination of a field in the field plane 13 as well as the shaping of the illumination in the exit pupil of the illumination system. The action of each field raster is such that it forms an image of light source 1, wherein a plurality of so-called secondary light sources is formed by the plurality of field facets. The secondary light sources are formed in or near the plane in which the pupil facet mirror 5 is disposed. Thus, as shown in FIG. 7, if the secondary light sources come to lie in the region of the pupil facet mirror 5, the field facets themselves can have an optical effect, for example, a collecting optical effect. These secondary light sources are imaged by the downstream optical elements as tertiary light sources in the exit pupil of the illumination system.

In addition, each field raster is imaged in the field plane 13 by the facets of the pupil facet mirror 5 and the downstream optical elements of the second optical component 7, which, in the example of FIG. 7, consists of the following three optical elements: a first reflective optical element 19, a second reflective optical element 21 and a grazing-incidence mirror 23. The images of the field facets that are superimposed there serve for the illumination of a mask 11 in the field plane 13, whereby, typically, starting from rectangular or arc-shaped field facets, an illumination in the form of an annular field segment arises in the field plane 13. In general, the microlithography system is formed as a scanning system, so that the mask 11 in the field plane 13 and a wafer 106 in the image plane 130 are moved synchronously in order to effect an illumination or an exposure.

The method according to the invention for preliminary adjustment can be applied with advantage also to optical systems outside the EUV wavelength region. In addition, an application to a plurality of optical systems is possible—to illumination or projection systems, for example. An example of the latter are objectives which are provided for the VUV or the DUV regions.

Within the scope of the invention, a projection exposure system for microlithography is also disclosed, in which, in its illumination or projection system, at least one temperature detector is integrated in order to carry out the method according to the invention. In addition, the invention also comprises a measurement stand for adjusting or for dimensioning optical systems, this stand possessing at least one temperature detector for conducting the method for the indirect determination of the local irradiance.

| List of reference numbers | |
|---|---|
| 1 | Light source |
| 2 | Optical beam path |
| 3 | First optical element with first raster elements (field facet mirror) |
| 5 | Second optical element with second raster elements (pupil facet mirror) |
| 7 | Second optical component |
| 9 | First collector unit |
| 10.1 | Optical component |
| 10.2 | Optical component |
| 11 | Pattern-bearing mask |
| 13 | Field plane |
| 19 | First reflective optical element |
| 21 | Second reflective optical element |
| 23 | Grazing-incidence mirror |
| 50 | Temperature detector |
| 52 | Plane of intersection in the optical beam path |
| 54 | Measurement object |
| 56 | Spectral filter |
| 60 | Regions of good heat conductivity on the measurement object |
| 62 | Regions of poor heat conductivity on the measurement object |
| 64 | Flat-shaped mirror of an optical component |
| 66.1, 66.2, 66.3 | Thermoresistors or thermocouples |
| 68.1, 68.2, 68.3 | Adjusting elements for adaptive optics |
| 102 | Second collector unit |
| 106 | Wafer provided with a light-sensitive material |
| 126 | Projection objective |
| 128.1, 128.2, 128.3 128.4, 128.5, 128.6 | Mirrors of the projection objective |
| 130 | Image plane |
| 200 | Raster element |
| 202 | Diaphragm plane |
| 204 | Diaphragm in the first collector unit |
| 400 | Normal-incidence concave mirror |
| 410 | Cleaning chamber |
| 500.1, 500.2, 500.3 500.4, 500.5, 500.6 500.7, 500.8, 500.9 500.10 | Individual facets |
| Z | Intermediate image of the light source |

What is claimed is:

1. A method, comprising:
providing an optical system that comprises:
optical elements configured to form a beam path for radiation passing through the optical system; and
a measurement object configured to absorb a portion of the radiation in the beam path, the measurement object being at least partially positioned in the beam path;
passing radiation through the optical system;
using a temperature detector to measure a temperature distribution of at least part of the measurement object; and
determining a beam profile of the radiation at the position of the measurement object based on the temperature distribution of the measurement object,
wherein the measurement object is a mirror.

2. The method of claim 1, wherein the at least part of the measurement object is the portion of the measurement object irradiated by the radiation.

3. The method of claim 1, wherein the temperature distribution of the measurement object is determined during the heating up of measurement object based on radiation absorbed by the measurement object.

4. The method of claim 1, wherein the temperature detector comprises a detector selected from the group consisting of a heat image camera, thermocouples and thermoresistors.

5. The method of claim 1, wherein the radiation comprises radiation selected from the group consisting of EUV, DUV and VUV.

6. The method of claim 1, wherein the measurement object is capable of being readjusted according to the temperature measurement.

7. The method of claim 1, further comprising using the optical system for the production of microelectronic components.

8. A method, comprising:
providing an optical system that comprises:
optical elements configured to form a beam path for radiation passing through the optical system; and
a measurement object configured to absorb a portion of the radiation in the beam path, the measurement object being at least partially positioned in the beam path;
passing radiation through the optical system;
using a temperature detector to measure a temperature distribution of at least part of the measurement object; and
determining a beam profile of the radiation at the position of the measurement object based on the temperature distribution of the measurement object,
wherein the measurement object is introduced into the beam path only during temperature measurement, and the measurement object does not absorb radiation from the beam path during normal operation of the optical system.

9. A method, comprising:
providing an optical system that comprises:
optical elements configured to form a beam path for radiation passing through the optical system; and
a measurement object configured to absorb a portion of the radiation in the beam path, the measurement object being at least partially positioned in the beam path;
passing radiation through the optical system;
using a temperature detector to measure a temperature distribution of at least part of the measurement object; and
determining a beam profile of the radiation at the position of the measurement object based on the temperature distribution of the measurement object,
wherein the temperature distribution of the measurement object is determined when stationary temperature gradients have formed.

10. A method, comprising:
providing an optical system that comprises:
optical elements configured to form a beam path for radiation passing through the optical system; and
a measurement object configured to absorb a portion of the radiation in the beam path, the measurement object being at least partially positioned in the beam path;
passing radiation through the optical system;
using a temperature detector to measure a temperature distribution of at least part of the measurement object; and
determining a beam profile of the radiation at the position of the measurement object based on the temperature distribution of the measurement object, wherein a lateral thermal conductivity of the irradiated surface of the measurement object is minimized by the geometric configuration and/or shaping of the measurement object.

11. A method, comprising:

providing an optical system that comprises:

optical elements configured to form a beam path for radiation passing through the optical system; and     a measurement object configured to absorb a portion of the radiation in the beam path, the measurement object being at least partially positioned in the beam path;

passing radiation through the optical system;

using a temperature detector to measure a temperature distribution of at least part of the measurement object; and determining a beam profile of the radiation at the position of the measurement object based on the temperature distribution of the measurement object, wherein the measurement object has roughly the properties of a black box.

12. A method, comprising:

providing an optical system that comprises:

optical elements configured to form a beam path for radiation passing through the optical system; and     a measurement object configured to absorb a portion of the radiation in the beam path, the measurement object being at least partially positioned in the beam path;

passing radiation through the optical system;

using a temperature detector to measure a temperature distribution of at least part of the measurement object; and determining a beam profile of the radiation at the position of the measurement object based on the temperature distribution of the measurement object, wherein a spectral filter, which essentially screens out undesired wavelengths of the radiation, is connected in series to the measurement object, and wherein the spectral filter is a film deposited on the measurement object.

* * * * *

UNITED STATES PATENT AND TRADEMARK OFFICE
CERTIFICATE OF CORRECTION

| | | |
|---|---|---|
| PATENT NO. | : 7,686,505 B2 | Page 1 of 1 |
| APPLICATION NO. | : 11/343471 | |
| DATED | : March 30, 2010 | |
| INVENTOR(S) | : Frank Melzer and Axel Scholz | |

It is certified that error appears in the above-identified patent and that said Letters Patent is hereby corrected as shown below:

Title page, Item (75), delete "Frank Meltzer" insert --Frank Melzer--.

Column 1, line 56, delete "systens" insert --systems--.

Column 2, line 56, delete "region, ," insert --regions,--.

Column 8 , line 56, delete "Glas" insert --Glass--.

Column 8, line 62-63, delete "conductivites" insert --conductivities--.

Signed and Sealed this

Fifteenth Day of June, 2010

David J. Kappos
*Director of the United States Patent and Trademark Office*